United States Patent
Zheng et al.

(10) Patent No.: US 10,602,154 B2
(45) Date of Patent: Mar. 24, 2020

(54) SYSTEM AND METHOD FOR DYNAMICALLY ADJUSTING A RECORDING BITRATE TO ACCOMMODATE A WRITING SPEED OF A STORAGE DEVICE

(71) Applicant: SZ DJI TECHNOLOGY CO., LTD., Shenzhen (CN)

(72) Inventors: Yuanhua Zheng, Shenzhen (CN); Lifu Yu, Shenzhen (CN); Taiwen Liang, Shenzhen (CN); Mingyu Wang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 341 days.

(21) Appl. No.: 15/414,844

(22) Filed: Jan. 25, 2017

(65) Prior Publication Data

US 2017/0134730 A1 May 11, 2017

Related U.S. Application Data

(63) Continuation of application No. PCT/CN2014/083264, filed on Jul. 29, 2014.

(51) Int. Cl.
*H04N 5/76* (2006.01)
*H04N 5/77* (2006.01)
(Continued)

(52) U.S. Cl.
CPC ....... *H04N 19/152* (2014.11); *G06F 13/1673* (2013.01); *G11B 27/10* (2013.01);
(Continued)

(58) Field of Classification Search
USPC .......................... 386/294, 291, 224, 239, 248
See application file for complete search history.

(56) References Cited

U.S. PATENT DOCUMENTS

| 5,949,795 A | * | 9/1999 | Moroney | H04J 3/0632 |
| | | | | 348/E5.003 |
| 7,359,324 B1 | * | 4/2008 | Ouellette | H04L 43/087 |
| | | | | 370/230 |

(Continued)

FOREIGN PATENT DOCUMENTS

| CN | 1313595 A | 9/2001 |
| CN | 1537309 A | 10/2004 |

(Continued)

OTHER PUBLICATIONS

The World Intellectual Property Organization (WIPO) International Search Report for PCT/CN2014/083264 dated May 6, 2015 pp. 1-4.

*Primary Examiner* — Daquan Zhao

(74) *Attorney, Agent, or Firm* — Anova Law Group, PLLC

(57) ABSTRACT

A system for adapting various writing speeds of storage devices and methods for making and using same are provided. A recording device maintains a data buffer with a buffer size. Data recorded by the recording device with a selected recording bitrate is stored into the data buffer of the recording device. The recorded data is written from the data buffer into a selected storage device that is attached onto the recording device. An amount of recorded data stored in the data buffer is compared with two or more sets of thresholds, and the recording bitrate of the recording device can be adjusted, as needed, in response to the results of the comparison. By adjusting the recording bitrate, the recording device advantageously can accommodate storage devices with various speeds while maintaining the quality of the recorded data and maximizing the capacity of the storage device.

12 Claims, 7 Drawing Sheets

(51) Int. Cl.
*H04N 19/152* (2014.01)
*G06F 13/16* (2006.01)
*G11B 27/10* (2006.01)
*G11B 27/36* (2006.01)
*H04N 5/91* (2006.01)
*H04N 9/80* (2006.01)
*G11C 7/16* (2006.01)

(52) U.S. Cl.
CPC ............... *G11B 27/36* (2013.01); *H04N 5/91* (2013.01); *G11C 7/16* (2013.01)

(56) References Cited

U.S. PATENT DOCUMENTS

| | | | |
|---|---|---|---|
| 8,780,174 B1 * | 7/2014 | Rawdon | H04N 5/23258 348/43 |
| 2005/0033879 A1 | 2/2005 | Hwang | |
| 2007/0053446 A1 * | 3/2007 | Spilo | H04L 1/0003 375/259 |
| 2008/0205217 A1 * | 8/2008 | Konieczny | G11B 20/10527 369/47.33 |
| 2009/0010112 A1 | 1/2009 | Yamada et al. | |
| 2009/0198874 A1 | 8/2009 | Tzeng | |
| 2012/0226833 A1 | 9/2012 | Mostinski | |
| 2013/0077942 A1 | 3/2013 | Zhao | |

FOREIGN PATENT DOCUMENTS

| | | |
|---|---|---|
| CN | 102264003 A | 11/2011 |
| CN | 102457707 A | 5/2012 |
| EP | 1633161 A1 | 3/2006 |
| JP | 2000092444 A | 3/2000 |
| JP | 2006174412 A | 6/2006 |
| JP | 2008160860 A | 7/2008 |
| JP | 2011035626 A | 2/2011 |
| JP | 2011048867 A | 3/2011 |
| JP | 4780005 B2 | 9/2011 |
| WO | 2011147242 A1 | 12/2011 |

* cited by examiner

US 10,602,154 B2

SYSTEM AND METHOD FOR DYNAMICALLY ADJUSTING A RECORDING BITRATE TO ACCOMMODATE A WRITING SPEED OF A STORAGE DEVICE

CROSS-REFERENCE TO RELATED APPLICATION

This is a continuation application of International Application No. PCT/CN2014/083264, filed on Jul. 29, 2014, the entire contents of which are incorporated herein by reference.

FIELD

The disclosed embodiments relate generally to memory storage systems and methods, and more particularly, but not exclusively, to a system and method for accommodating the writing speeds of various storage devices by adjusting a recording bitrate of a recording device.

BACKGROUND

Many recording devices are equipped with functionalities of continuous data recording, wherein the recorded data is generally stored to a storage device. Typical recording devices include cameras with image recording capability and audio recording devices, such as digital voice recorders. The amount of data created per unit time, a definition for bitrate, varies among the recording devices used to generate recorded data. Some of those devices are able to generate recorded data with very high bitrates. On the other hand, available storage devices of different grades provide different writing speeds, which are also influenced by the sizes and operating environment of the storage devices.

Several issues exist in such typical systems when the recording device attempts to write recorded data to the storage device. When the amount of recorded data created in a unit time period by the recording device exceeds the writing speed of the storage device, the data write operation fails, and so does the data recording. In other words, the storage device is not fast enough to receive and store the data generated by the recording device. To resolve this issue, the storage device would need to be replaced by one with higher writing speed, or the recording device would need to be configured to a lower bitrate. Because of the recording bitrate reduction, the quality of the records stored in the storage device is reduced.

For example, a camera can store continues image data to an SD card attached to the camera. If the camera is adjusted to a high resolution setting, a large amount of image data will be generated per unit time. The high bitrate of the image data increases the requirement for the minimum writing speed of the SD card, meaning high cost for the images recorded. Alternatively, if an SD card with a lower writing speed is used, the recording bitrate of the camera would need to be reduced to accommodate the lower writing speed of the SD card, sacrificing the quality of the images recorded.

Therefore, there is a need for a system and method for accommodating storage devices with various speeds while maintaining the quality of the recorded data and maximizing the capacity of the storage device.

SUMMARY

In accordance with a first aspect of the subject matter disclosed herein, a method is provided for enabling a recording device with an adjustable recording bitrate to adapt to a predetermined writing speed of a storage device, such as a secure digital (SD) card, removably attached to the recording device, the method comprising: storing data recorded by the recording device at a selected recording bitrate in a data buffer coupled with the recording device; writing the recorded data from the data buffer into the storage device; determining whether the recorded data in the data buffer has reached a predetermined threshold selected from two or more sets of predetermined thresholds; and adjusting the recording bitrate of the recording device in accordance with the determining.

In accordance with some embodiments, the method further comprises establishing the two or more sets of predetermined thresholds.

In accordance with some embodiments of the method, the establishing the two or more sets of predetermined thresholds comprises establishing a set of ascending thresholds reflecting ascending data amount changes of the data buffer and a set of descending thresholds reflecting descending data changes of the data buffer.

In some embodiments, the method further comprises detecting a trend of data amount and a data amount within the data buffer.

In some embodiments of the method, the detecting includes comparing amounts of the recorded data within the data buffer by polling the data amount at specified time intervals.

In some other embodiments, the establishing the set of ascending thresholds includes: establishing a first specified ascending threshold within a range of sixty percent (60%) to eighty percent (80%) of the buffer size, such as seventy-five percent (75%) of the buffer size: and establishing a second specified ascending threshold being greater than the first specified ascending threshold and within a range of seventy percent (70%) to ninety-five (95%) of the buffer size, such as ninety percent (90%) of the buffer size.

In some preferred embodiments of the method, the establishing a set of descending thresholds includes establishing a first specified descending threshold within a range of thirty percent (30%) to fifty percent (50%) of the buffer size, such as thirty percent (30%) of the buffer size.

In some embodiments of the method, the adjusting the recording bitrate of the recording device includes at least one of: reducing the recording bitrate when the recorded data in the data buffer reaches above a first specified ascending threshold; stopping the data recording when the recorded data in the data buffer reaches above a second specified ascending threshold; and increasing the recording bitrate when the recorded data in the data buffer reaches below a specified descending threshold.

In some embodiments of the method, the adjusting a recording bitrate of the recording device further includes reducing the recording bitrate to a range of thirty percent (30%) to eighty percent (80%) of the selected recording bitrate, such as fifty percent (50%) of the selected recording bitrate, when the data in the data buffer reaches the first specified ascending threshold.

In some embodiments of the method, the adjusting a recording bitrate of the recording device includes at least one of: stopping the data recording when the recorded data in the data buffer reaches above the second specified ascending threshold; increasing the recording bitrate to the selected recording bitrate when the recorded data in the data buffer reaches below the first specified descending threshold; and maintaining the recording bitrate when the recorded data in the buffer is between the second specified ascending threshold and the first specified descending threshold.

In some embodiments of the method, the establishing the set of descending thresholds further includes establishing a second specified descending threshold within the range of seventy percent (70%) to ninety-five percent (95%) of the buffer size, such as ninety percent (90%) of the buffer size.

In some embodiments of the method, the adjusting the adjustable recording bitrate of the recording device includes at least one of: stopping the data recording when the recorded data in the data buffer reaches above the second specified ascending threshold; and after the data recording is stopped, resuming the data recording with a reduced recording bitrate when the recorded data in the data buffer reaches below the second specified descending threshold being greater than the first specified descending threshold.

In some embodiments of the method, the recording device is an image recording device or an audio recording device.

In some embodiments, the storing data further comprises configuring the data buffer with a buffer size within a range of 16 MB to 512 MB, such as 64 MB.

In accordance with the second aspect of this subject matter disclosed, a recording device with an adjustable recording bitrate to adapt to a predetermined writing speed of a storage device, such as a secure digital (SD) card, removably attached to the recording device is provided, the recording device comprising: a data buffer with a buffer size for storing recorded data and for writing the recorded data into the storage device; and, a control system for determining whether the recorded data in the data buffer has reached a predetermined threshold selected from two or more sets of predetermined thresholds and adjusting the recording bitrate of the recording device in response to the recorded data in the data buffer reaching the predetermined threshold.

In some embodiments, the two or more sets of predetermined thresholds comprise a set of ascending thresholds associated with ascending data changes of the data buffer and a set of descending thresholds associated with descending data changes of the data buffer.

In some embodiments, the one set of ascending thresholds comprises: a first specified ascending threshold within a range of sixty percent (60%) to eighty percent (80%) of the buffer size, preferably seventy-five percent (75%) of the buffer size; and a second specified ascending threshold, being greater than the first specified ascending threshold, within a range of seventy percent (70%) to ninety-five percent (95%) of the buffer size, such as ninety percent (90%) of the buffer size.

In some embodiments, the one set of descending thresholds comprise a first specified descending threshold within a range of thirty percent (30%) to fifty percent (50%) of the buffer size, such as 30% of the buffer size.

In some other embodiments, the control system reduces the recording bitrate when the recorded data in the buffer reaches the first specified ascending threshold, the reduced recording bitrate being in the range of thirty percent (30%) to eighty percent (80%) of the selected recording bitrate, such as fifty percent (50%) of the selected recording bitrate.

In some preferred embodiments, the control system stops the data recording when the recorded data in the data buffer reaches above the second specified ascending threshold; the control system increases the recording bitrate to the selected recording bitrate when the recorded data in the data buffer reaches below the first specified descending threshold; the control system maintains the recording bitrate when the recorded data in the data buffer is between the second specified ascending threshold and the first specified descending threshold.

In some embodiments of the recording device, the storage device comprises a secure data (SD) card.

In some other embodiments of the recording device, the storage device is removably attached with the recording device.

In some other embodiments, the recording device is a camera capable of recording image data or an audio recorder capable of recording audio data.

In the third aspect of the subject matter, an unmanned aerial vehicle (UAV) is provided, comprising a vehicle body and a recording device according to any one of the embodiments coupled with the vehicle body.

Figure 1:
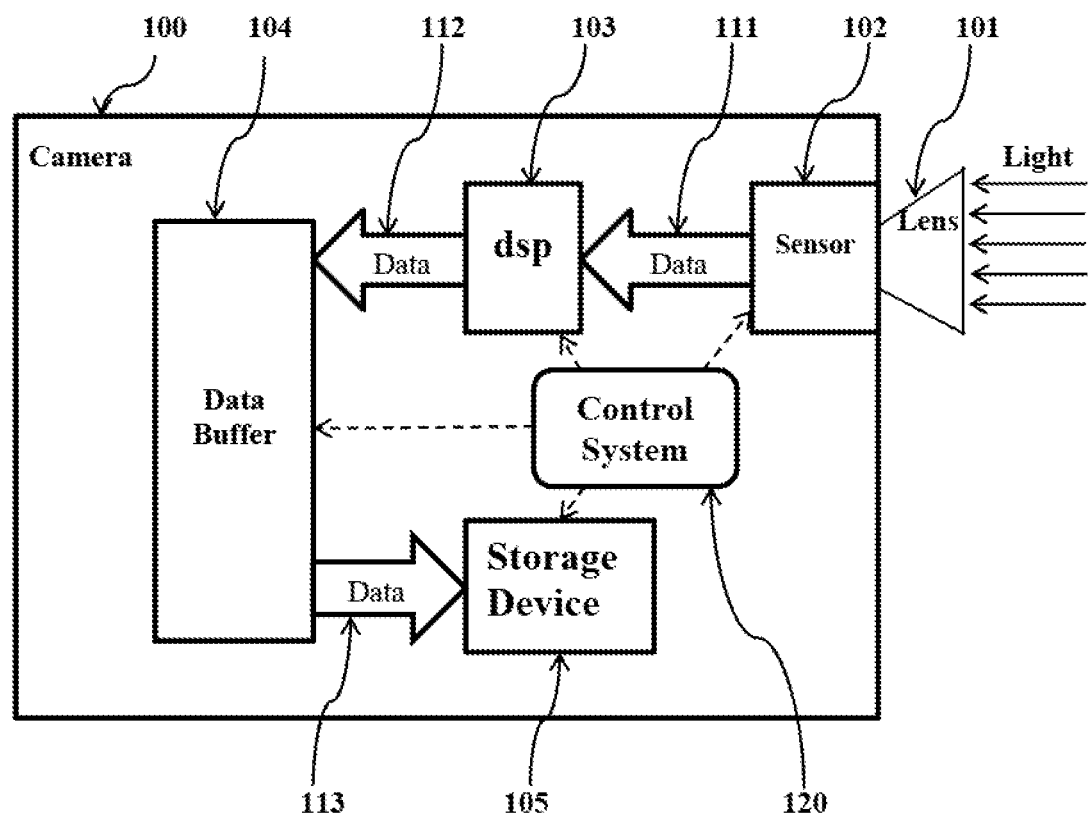
FIG. 1 is an exemplary top-level block diagram illustrating an embodiment of a recording device with a data buffer.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

The present disclosure sets forth a system and method for allowing a recording device to adapt removable storage devices, such as secure digital (SD) cards, with various writing speeds. Although generally applicable to any conventional type of recording device that stores recorded data into a removable storage device, the system and method will be described with reference to a camera capable of recording continues images for storage on a secure digital (SD) card for illustrative purposes only.

Turning to FIG. 1, a camera 100 is illustrated as having a lens 101 for receiving light that represents an image (not shown). The light received via the lens 101 is provided to a sensor 102 for generating data flow 111. The data flow 111 typically is an analog data flow that comprises continues image data, i.e. video data. Data flow 111 is converted into digital data flow 112 via a digital signal processor (DSP) 103. The digital data in data flow 112 includes digitized image data and is shown as being written into a data buffer 104, which may be allocated in the internal and/or external camera memory (not shown) of the camera 100. The data buffer 104, in turn, provides digital data in data flow 113 to a storage device 105, such as a secure digital (SD) card. The digitized image data thereby is stored in the storage device 105. Therefore, the data buffer 104 can serve as a temporary data holding area between the data flow 112 created by the DSP 103 and storage device 105. In addition, the data flow 111 corresponds with a recording filtrate of the camera 100. The data flow 112 is directly related to data flow 111. Therefore, data flow 112 is indirectly related to the recording bitrate. As indicated in FIG. 1, all elements (102,103, 104 and 105) of the camera 100 operate under control of a control system 120.

Figure 5:
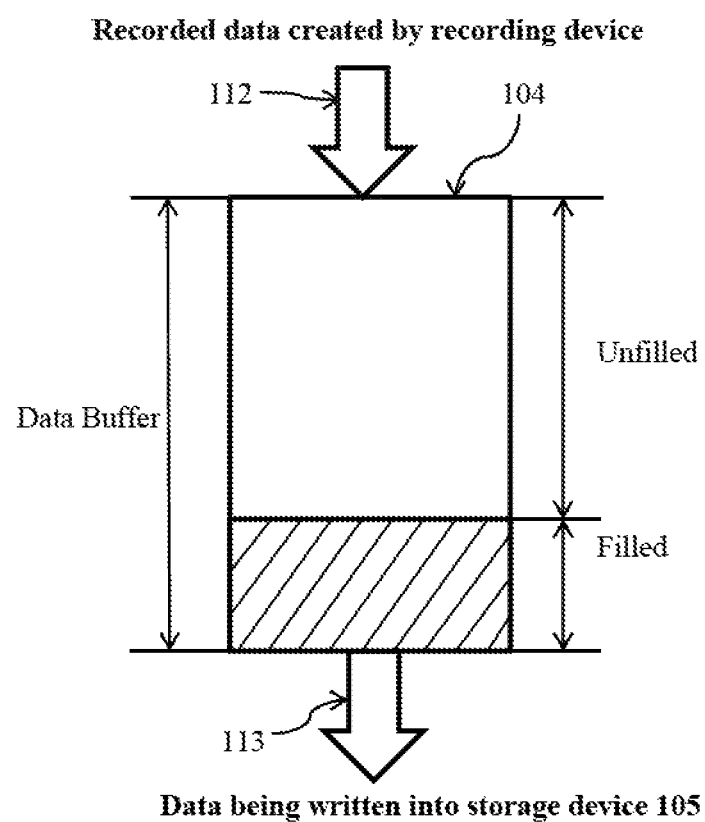
FIG. 5 is an exemplary block diagram illustrating an embodiment of the data buffer of FIG. 1.

Now referring to FIG. 5, which shows the data flows 112, 113 entering and exiting the data buffer 104. As discussed above, the data flow 112 is the data flow writing into the data buffer 104. On one hand, the filled portion of data buffer 104 tends to expand as data flow 112 is written into the data buffer 104. On the other hand, when the recorded data in the data buffer 104 is read out to the storage device 105 (shown in FIG. 1), the filled portion of the data buffer 104 tends to shrink because corresponding space is flushed in the data buffer 104 once the recorded data is read out. The writing speed of the storage device 105 is normally fixed for a particular storage device 105 because the speed is specific to hardware configurations of the storage device 105. So, one purpose of the method 200 is to maintain a data amount (or data level) in the data buffer 104 by controlling the data flow 112, which is accomplished by adjusting the recording speed of the camera 100 (shown in FIG. 1).

Figure 2A:
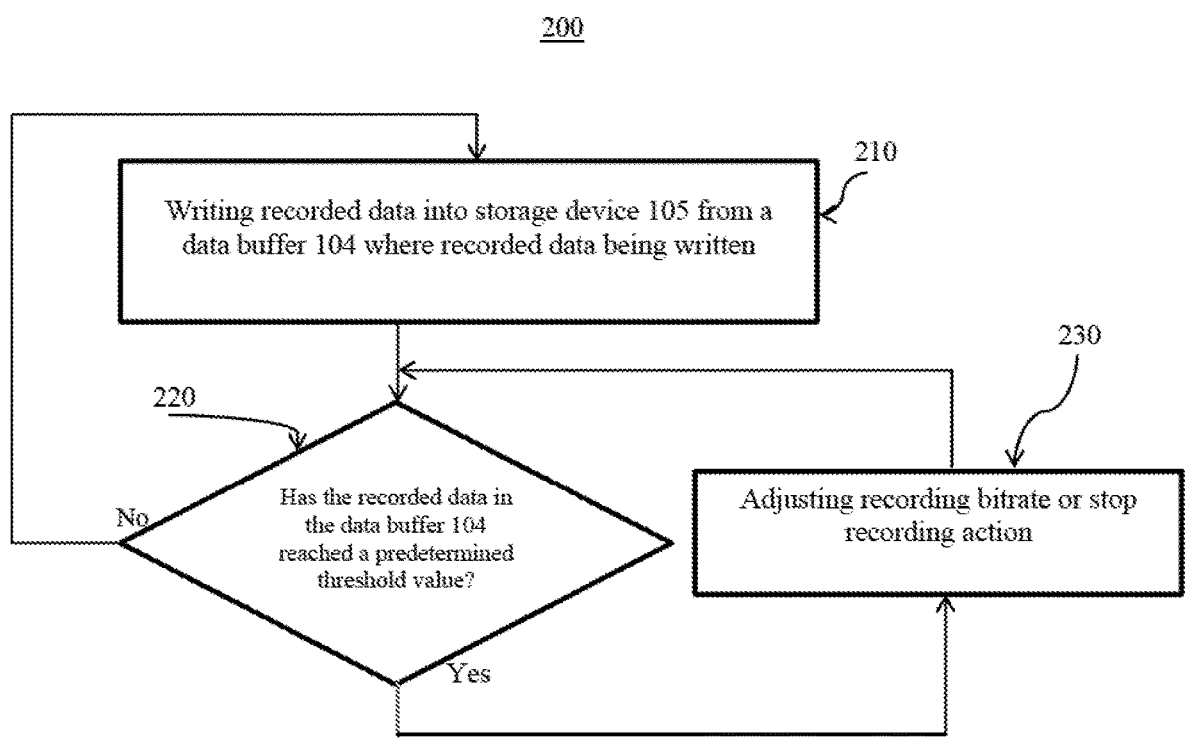
FIG. 2A is an exemplary top-level flowchart illustrating an embodiment of a method for maintaining the data buffer of FIG. 1.

FIG. 2A shows a top-level overview of a method 200 for enabling a recording device, such as camera 100 (shown in FIG. 1), to adapt a storage device 105 (shown in FIG. 1), selected from a plurality of storage devices with various writing speeds. In FIG. 2A, the method 200 is shown in three simple function blocks 210, 220 and 230. At function block 210, the recording device starts a data recording, which simply includes writing its recorded data into a data buffer 104 (shown in FIG. 1), from where the recorded data is written into the storage device 105. When the data recording is started, a control system 120 of the recording device starts to monitor the data amount of the data buffer 104, as indicated at 220. When the data amount of the data buffer 104 reaches a predetermined threshold, the control system 120 (shown in FIG. 1) will control the data amount by either adjusting the recording bitrate configured with the recording device or stopping the data recording, as indicated in function block 230. When the data recording is stopped, the control system 120 keeps monitoring whether the recorded data in the data buffer 104 drops below a predetermine threshold, as shown at 220. When the data buffer 104 drops below the predetermine threshold, the control system 120 will resume the data recording of the recording device by adjusting the recording bitrate, as shown at 230.

Figure 2B:
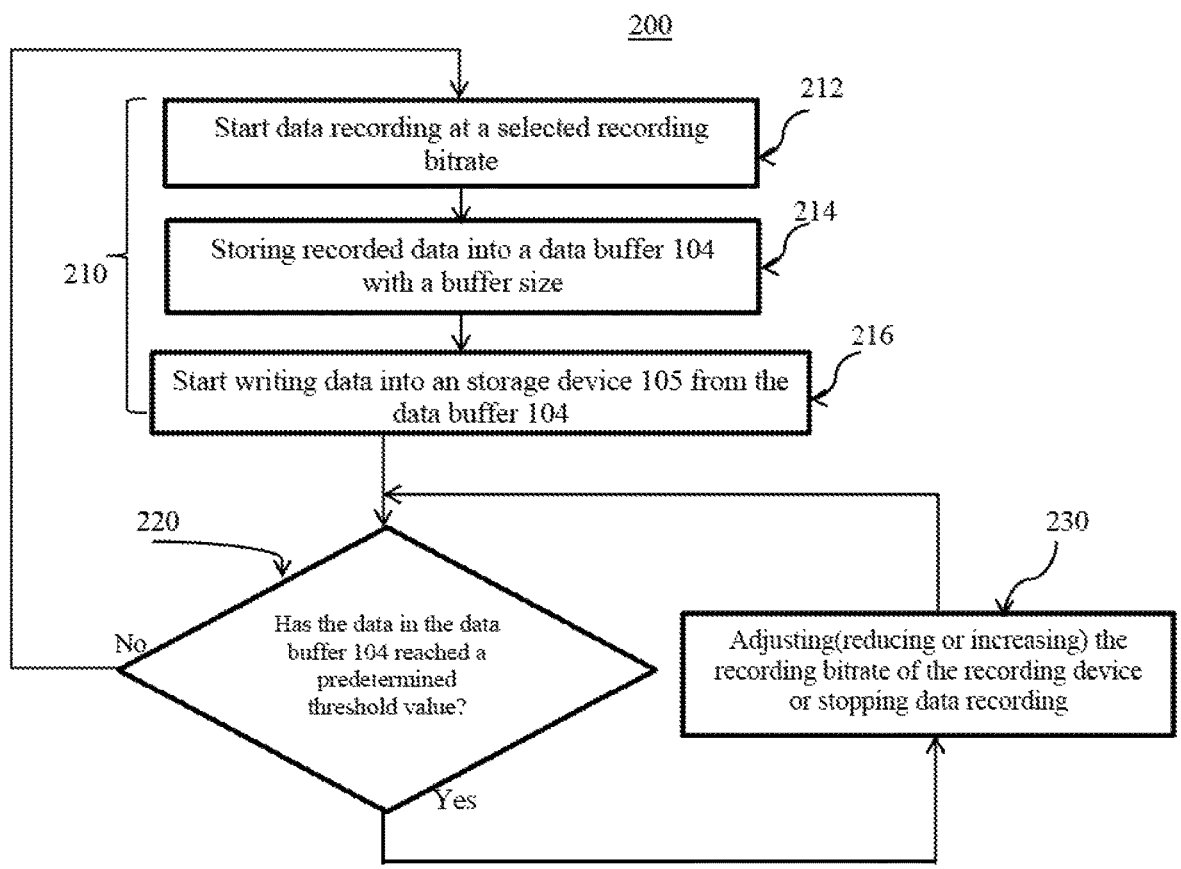
FIG. 2B is an exemplary flowchart further illustrating the embodiment of the method of FIG. 2A, wherein data recording starts at a selected bit rate and the recorded data is stored in a data buffer.

An alternative embodiment of the method 200 is illustrated in FIG. 2B. The initial function block 210 in FIG. 2B is divided into three blocks: the recording device is started at a selected recording bitrate at 212; the recorded data is stored into a data buffer 104 (shown in FIG. 1) with a buffer size; and the recorded data in the data buffer 104 is read out for writing into an storage device 105 (shown in FIG. 1). When image recording of the camera is started with the data buffer 104 empty, the camera 100 (shown in FIG. 1) can record image data with a selected recording bitrate, such as a default recording bitrate. The selected recording bitrate may be the recording bitrate that can maximize the quality of the recorded images and/or a bitrate that is selected by the user with certain considerations, such as the specified writing speed of the storage device 105 and/or the expectations for the quality of the recorded images.

The data buffer 104 can be configured according to actual applications. For the camera 100, the data buffer 104 can be established with a buffer size between of 16 MB and 512 MB, including any sub-ranges, such as a 32 MB sub-range (e.g. between 32 MB and 64 MB). In some embodiments, the buffer size is 64 MB. Considerations for the size of the data buffer 104 may include the selected recording bitrate, the writing speed of the storage device 105 and/or available memory of the recording device.

The recorded data in the data buffer 104 is written to the attached storage device 105 in a speed that is specific to hardware configurations of the storage device 105, as illustrated in FIG. 5. In another words, the writing speed of the storage device 105 is fixed. In addition, the writing speed may be uncontrollably affected by the size, the available volume of the storage device 105, and or environmental conditions, such as the temperature. As shown in FIG. 5, when the speed of the writing into the data buffer 104 is higher than the reading out speed from the data buffer 104, the data accumulates within the data buffer 104, and the usage level of the data buffer 104 ascends (or the filled portion expands as illustrated in FIG. 5). On the other hand, when the speed of the writing into the data buffer 104 is lower than the reading out speed from the data buffer 104, the recorded data does not accumulate in the data buffer 104, and the usage level of the data buffer 104 descends (or the filled portion shrinks as shown in FIG. 5).

Figure 6:
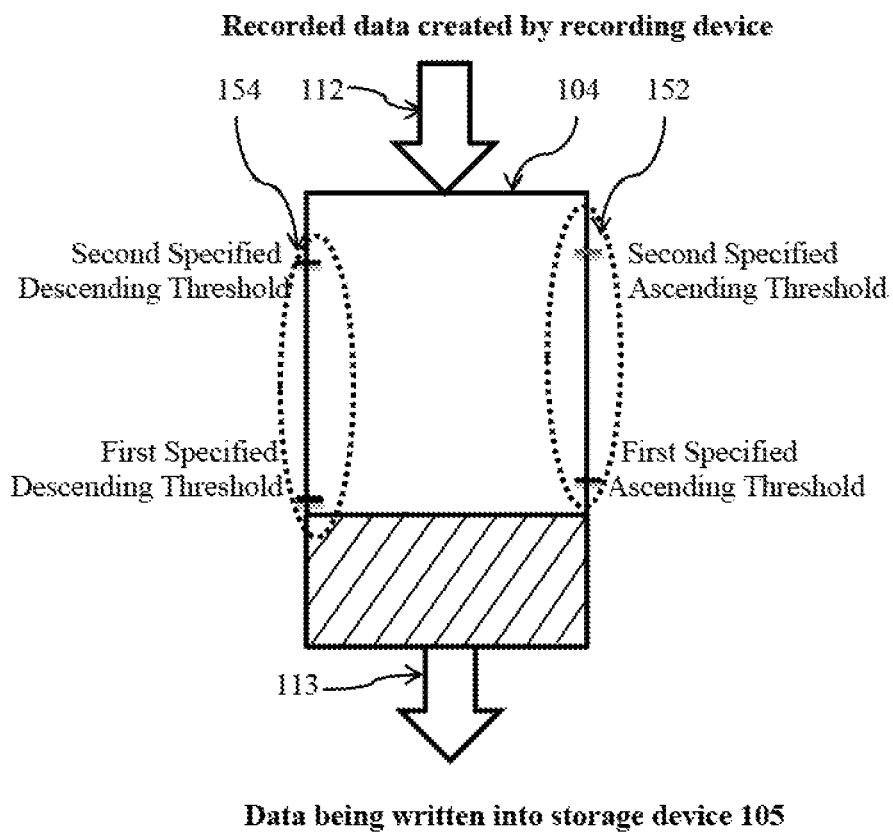
FIG. 6 is an exemplary block diagram illustrating an embodiment of the data buffer of FIG. 5, wherein two sets of thresholds are associated with the data buffer.

In one embodiment, two or more sets of thresholds are provided for signaling the data amount within the data buffer 104. As an illustrative example, FIG. 6 shows two sets of thresholds 152, 154 with the data buffer 104. One set of the data amount thresholds informs the control system 120 (shown in FIG. 1) of the recording device when the data amount within the data buffer 104 ascends above one or more predetermined thresholds. The other one set of thresholds informs the control system 120 of the recording device when the data amount descends below one or more predetermined thresholds. Even though two sets of thresholds are described for purposes of illustration only, any suitable preselected number of sets of thresholds can be provided to the data buffer 104 to address different requirements of various applications.

In order to achieve the above discussed purpose, the control system 120 of the recording device can detect the data amount within the data buffer 104 and/or a trend of the data amount within the data buffer 104. In order to keep track of the data amount within the data buffer 104, a first data amount variable V1 is associated with the recording device and can be refreshed when the data flow 112 is written into data buffer 104 and/or when the data flow 113 is read out from the data buffer 104. The first data amount variable V1 is initialized to zero. When an amount of data is written into the data buffer 104, the amount written is added onto the first data amount variable V1, and, when an amount of data is read out from the data buffer 104, the amount read is subtracted from the first data amount variable V1. The control system 120 polls the first data amount variable V1 at predetermined time intervals.

For the same purpose, the control system 120 of the recording device combines a trend of the data amount change of the data buffer 104 with the first data amount variable V1 to implement ascending thresholds and; descending thresholds. In an embodiment, a second data amount variable V2 is provided for storing the value of V1 at a previous polling time, i.e. the data amount in the data buffer 104 at an immediately preceding polling time. When detecting whether a threshold has been triggered at a selected polling time, the control system 120 determines the trend of the data amount change between the previous polling time and the selected polling time and then checks whether any of the thresholds conforming to the trend has been reached.

Figure 7:
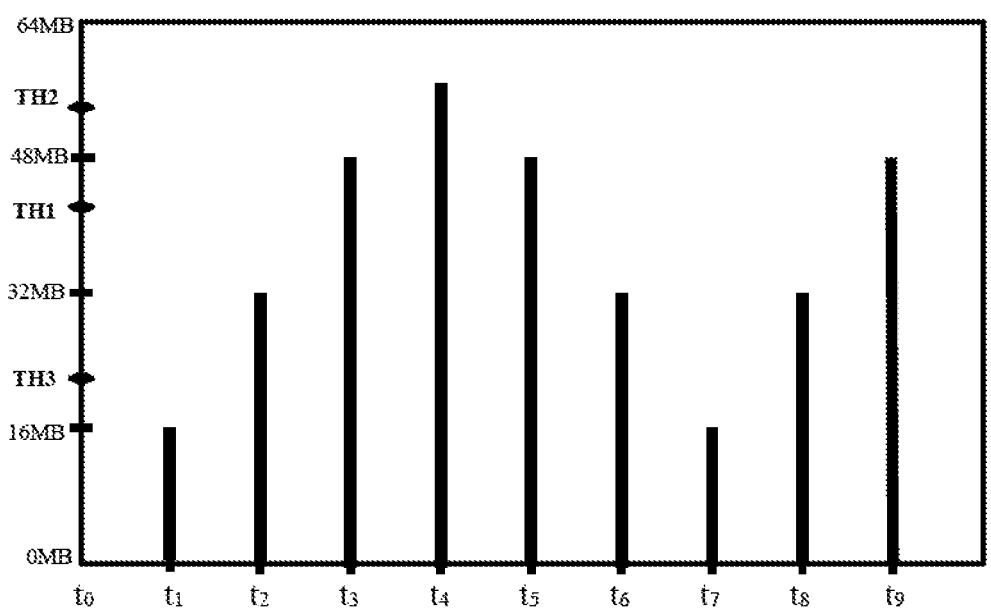
FIG. 7 is an exemplary timeline diagram showing illustrative amounts of recorded data in the data buffer of FIG. 6 at specified time points.

As an illustrative example, FIG. 7 shows three thresholds including two ascending thresholds: first ascending threshold TH1 at 42 MB and second ascending threshold TH2 at 54 MB, and one descending threshold TH3 at 21 MB. In addition, FIG. 7 also shows the data amounts at polling times $t_0$ to $t_9$, respectively. Referring to FIG. 7, at polling time $t_0$, both the first and second data amount variables V1, V2 are initialized to zero and the data amount of the data buffer 104 (shown in FIG. 6) is 0 MB.

At polling time $t_1$, the second data amount variable V2 remains at zero reflecting the data amount of the data buffer 104 at last polling time $t_0$, and the first data amount variable V1 becomes 16 MB. The data amount in the data buffer 104 is ascending because the first data amount variable V1 has a value that is greater than the value of the second data amount variable V2; therefore, the first data amount variable V1 is compared to only the ascending thresholds. In this case, no threshold is triggered since the first data amount variable V1 has reached above no ascending threshold.

At polling time $t_2$, the second data amount variable V2 has a value of 16 MB reflecting the data amount of the data buffer 104 at polling time $t_1$ and first data amount variable V1 becomes 32 MB. There is no threshold triggered since the data amount of the data buffer 104 is ascending (the first data amount variable V1 has a value that is greater than the value of the second data amount variable V2), and the first data amount variable V1 has reached above no ascending threshold.

At polling time $t_3$, the second data amount variable V2 has a value of 32 MB reflecting the data amount of the data buffer 104 at last polling time $t_2$, and the first data amount variable V1 becomes 48 MB. The data amount in the data buffer 104 is ascending because the first data amount variable V1 has a value that is greater than the value of the second data amount variable V2; therefore, the first data amount variable V1 is compared to only the ascending thresholds. In this case, the first ascending threshold TH1 (42 MB) is triggered because the first data amount variable V1 has reached above the first ascending threshold TH1 (42 MB).

At polling time $t_4$, the second data amount variable V2 has a value of 48 MB reflecting the data amount of the data buffer 104 at last polling time $t_3$, and the first data amount variable V1 becomes 56 MB. The data amount in the data buffer 104 is ascending because the first data amount variable V1 has a value that is greater than the value of the second data amount variable V2; therefore, the first data amount variable V1 is compared to only the ascending thresholds. In this case, the ascending threshold TH2 is triggered because the first data amount variable V1 has reached above ascending TH2 (54 MB).

At polling times $t_5$ and $t_6$, The data amount of the data buffer 104 is descending because the first data amount variable V1 has a value that is less than the value of the second data amount variable V2; therefore, the first data amount variable V1 is compared to only the descending threshold TH3 (21 MB). In this case, no threshold is triggered since the first data amount variable V1 has not reached below the descending threshold TH3.

At polling time $t_7$, the second data amount variable V2 has a value of 32 MB reflecting the data amount of the data buffer 104 at last polling time $t_6$ and the first data amount variable V1 becomes 16 MB. The data amount of the data buffer 104 is still descending because the first data amount variable V1 has a value that is less than the value of the second data amount variable V2; therefore, the first data amount variable V1 is compared to only the descending threshold TH3 (21 MB). In this case, the first data amount variable V1 has reached below the descending threshold TH3 (21 MB); therefore, the descending threshold TH3 is triggered.

Similarly, at polling time $t_8$, no threshold is triggered and at polling time $t_9$, the ascending threshold TH1 (42 MB) is triggered.

In the above embodiment, when a task scheduling interval of the control system 120 is 1 ms, the actual polling interval for the variable V1 can be between 20 ms and 100 ms including any sub-ranges, such as a 10 ms sub-range (e.g. between 50 ms and 60 ms). The interval can be affected, for example, by the number and natures of tasks miming by the control system.

The above embodiment is an exemplarily implementation only. Other methods of implementing directional thresholds can be utilized too, for example, allocating two variables, one for storing the trend of the data amount change and the other one for storing the data amount of the data buffer 104.

After block 210 as shown in FIG. 2B, the control system 120 of the recording device continues to monitor the data amount of the data buffer 104, as indicated at 220. If any of the thresholds, either ascending or descending, is reached and/or passed, the control system 120 can take predetermined action (as discussed in detail below) in response to the data amount change; otherwise, the control system 120 can keep performing the actions that the recording device has been doing after block 210.

When the control system 120 receives a threshold triggering signal reflecting the trend and the amount of the recorded data within the data buffer 104, the control system 120 adjusts the recording bitrate of the recording device to control the data amount of the data buffer 104 in an effort to avoid data overflow and/or to achieve maximum recording quality, as indicated at 230. Available actions include reducing the bitrate for data recording when the data level of the data buffer 104 is too high while ascending. Thereby, the data writing speed into the data buffer 104 is reduced in an effort to reach a new balance between the speed of writing into the data buffer 104 and the speed of reading out from the data buffer 104. An alternatively and/or additional action can include increasing the recording bitrate, if possible, when the data usage is too low while descending. The recording bitrate cannot be further increased, for example, if the maximum recording bitrate is being used by the recording device. Increasing the recording bitrate can be used to maximize the quality for data recording. When the data amount of the data buffer 104 reaches over a threshold reflecting a danger of buffer overflow, the control system 120 may stop the data recording and wait for the data amount to decrease to avoid possible recording failure due to buffer overflow, at 230. The control system 120, at 220, keeps monitoring the data change and the data amount.

Figure 3:
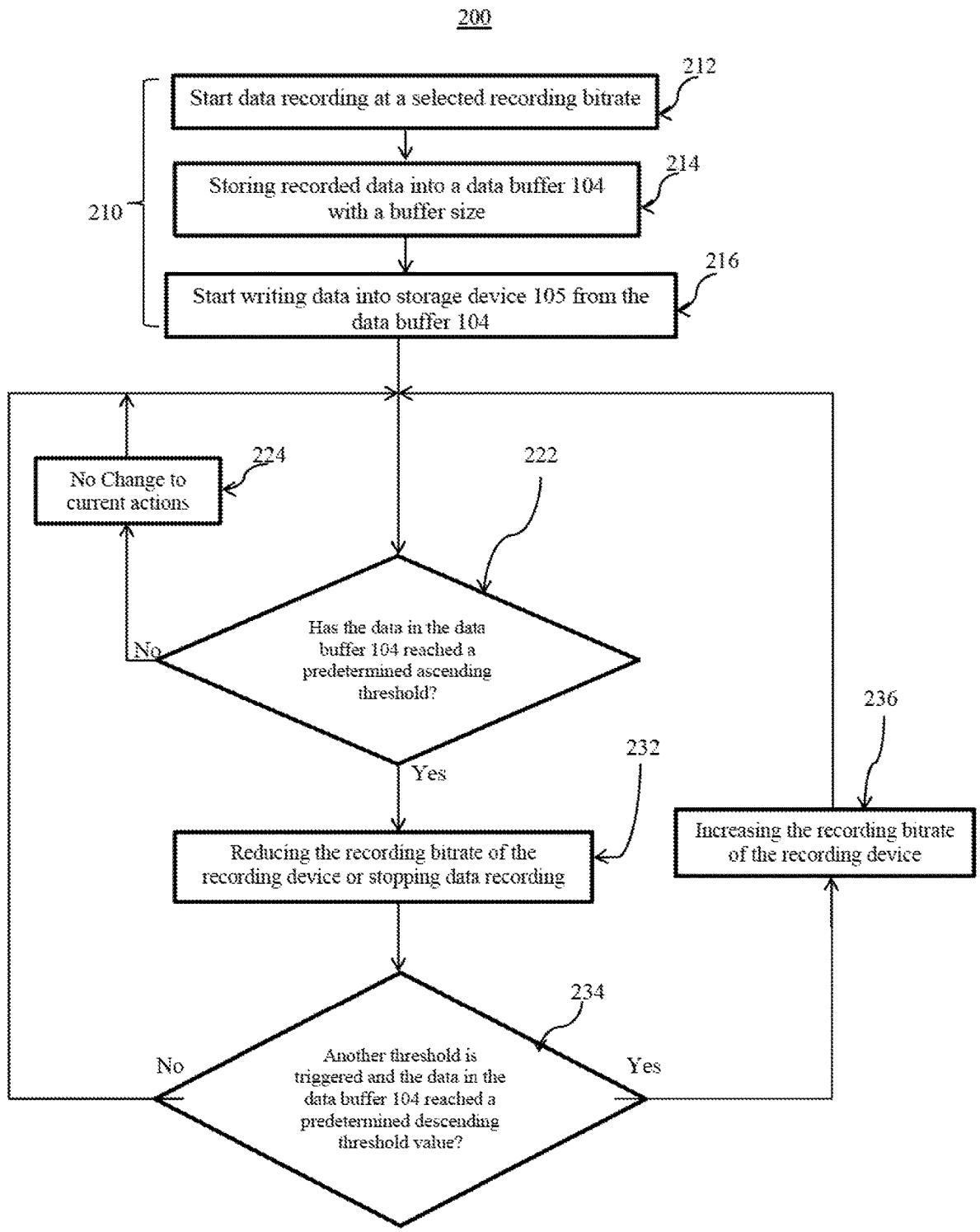
FIG. 3 is an exemplary flowchart illustrating the embodiment of the method of FIG. 2B, wherein a volume of recorded data stored in the buffer is compared to both an ascending threshold and a descending threshold.

An alternative embodiment of method 200 is illustrated in FIG. 3. In FIG. 3, the starting block 210 is same as discussed in FIG. 2B with three sub-blocks 212, 214 and 216. However, block 220 (shown in FIG. 2B) of the method 200 is divided into steps 222 and 224; and block 230 (shown in FIG. 2B) is divided into steps 232, 234 and 236.

In the method 200 shown in FIG. 3, the control system 120 (shown in FIG. 1) of the recording device, such as the camera 100 (shown in FIG. 1) monitors whether a specific ascending threshold is triggered after the initial block 210. If the specific ascending threshold is not triggered, the control system 120 does not take any action as shown in function block 224, in which the recording system keeps its data recording with the selected recording bitrate as described in FIG. 2B and writing the data within the data buffer 104 (shown in FIG. 1) into the attached storage device 105 (shown in FIG. 1) in the manner as described with reference to FIG. 2B.

However, when the specific ascending threshold triggering signal is received, the control system 120 can reduce the recording bitrate of the recording device and/or stop the data recording of the recording device, as indicated in functional block 232. When one of such actions is taken, the control system 120 continues monitoring the data amount of the data buffer 104 until a new threshold is reached or passed as described in decision blocks 234 and 222.

As described in decision block 234, if the data amount of the data buffer 104 reaches below a specific descending threshold after the reduction to the recording bitrate of the recording device, indicating the reduction is effective, the control system 120 of the recording device can increase the recording bitrate of the recording device, at 236, including resuming the selected recording bitrate as described in FIG. 2B; if the data amount of the data buffer 104 triggers another ascending threshold after the reduction to the recording bitrate, the control system 120 may take further actions to decrease the recording bitrate of the recording device or even stop the recording, if the recording has not been stopped already, as described in blocks 302 and 305. In any function block in FIG. 3, if no threshold signal is triggered, the control system 120 does not change the current actions of the recording device. At any time, if there is any data in the data buffer 104, the control system 120 keeps writing the data in the data buffer 104 into the attached storage device 105 with the built-in writing speed of the storage device 105.

Figure 4:
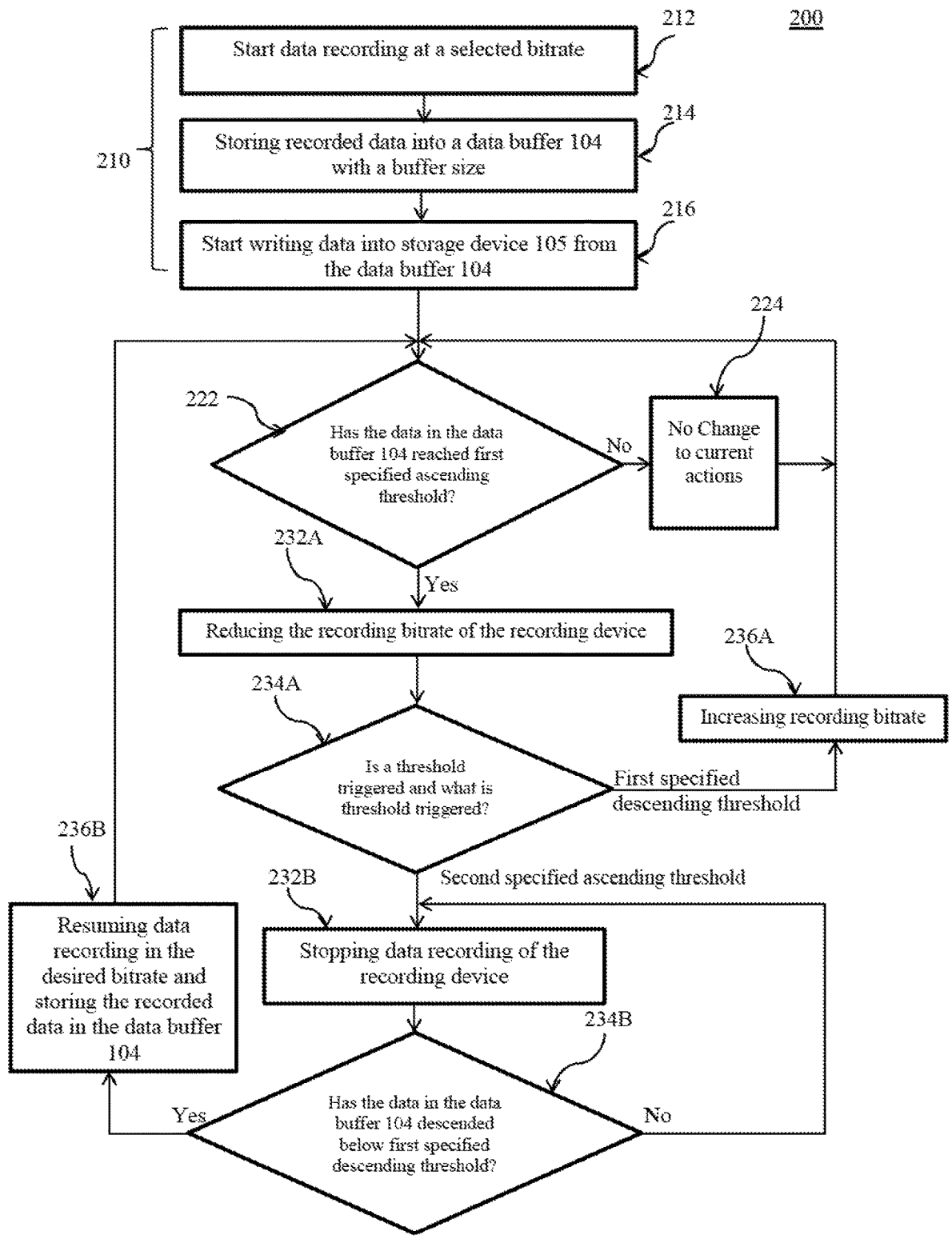
FIG. 4 is an exemplary flowchart illustrating the embodiment of the method of FIG. 2, wherein the volume of recorded data stored in the buffer is compared to two sets of thresholds.

In a preferable embodiment as illustrated in FIG. 4, as described for FIG. 2B and for FIG. 3, two or more sets of thresholds (as 152 and 154 shown in FIG. 6) are provided with the data buffer 104. Of the two or more sets of thresholds, at least one set are ascending thresholds for informing the control system 120 (shown in FIG. 1) of the recording device when the data amount is ascends above one or more predetermined thresholds (as 152 shown in FIG. 6). At least another set of thresholds are descending thresholds for informing the control system 120 of the recording device when the data amount descends below one or more predetermined thresholds (as 154 shown in FIG. 6).

The one set of ascending thresholds 152 may include a first specified ascending threshold with lower value and a second specified ascending threshold with higher value. An exemplary preselected ranges for the first specified ascending threshold can include between sixty percent (60%) and eighty percent (80%) of the buffer size, including any percentage sub-ranges, such as a five percent sub-range (e.g., between sixty-five percent (65%) and seventy percent (70%)) and/or a ten percent sub-range (e.g., between sixty percent (60%) and seventy percent (70%)), within the preselected percentage range, without limitation. A preferred percentage value of the first specified ascending threshold is seventy-five percent (75%) of the buffer size. An exemplary preselected ranges for the second specified ascending threshold can include between seventy percent (70%) and ninety-five percent (95%) of the buffer size, including any percentage sub-ranges, such as a five percent sub-range (e.g., between seventy-five percent (75%) and eighty percent (80%)) and/or a ten percent sub-range (e.g., between eighty percent (80%) and ninety percent (90%)), within the preselected percentage range, without limitation. A preferred percentage value of the second specified ascending threshold is ninety percent (90%) of the buffer size.

The one set of descending thresholds 154 may include a first specified descending threshold. An exemplary preselected ranges for the first specified descending threshold can include between thirty percent (30%) and fifty percent (50%) of the buffer size, including any percentage sub-ranges, such as a five percent sub-range (e.g., between thirty-five percent (35%) and forty percent (40%)) and/or a ten percent sub-range (e.g., between forty percent (40%) and fifty percent (50%)), within the preselected percentage range, without limitation. A preferred percentage value of the first specified descending threshold is thirty-five percent (35%) of the buffer size.

At 222 of FIG. 4, the control system 120 of the recording device monitors whether the first specified ascending threshold is triggered.

When the control system 120 receives a triggering signal of the first specified ascending threshold, the control system 120 of the recording device reduces the recording bitrate of the recording device, as function block 232A is indicated. The reduction of recording bitrate, in turn, reduces the data generating speed and slows down the filling up speed of the data buffer 104. The reduction percentage ranges for recording bitrate include between thirty percent (30%) and eighty percent (80%) of the selected recording bitrate, including any percentage sub-ranges, such as a five percent sub-range (e.g., between fifty-five percent (55%) and sixty percent (60%)) and/or a ten percent sub-range (e.g., between sixty percent (60%) and seventy percent (70%)), within the preselected percentage range, without limitation. The preferred value of the reduced recording bitrate is fifty percent (50%) of the selected recording bitrate.

After the recording bitrate reduction, three possible outputs may be achieved as a result of the reduction of the recording bitrate: (1) a new balance is reached between the speed of writing into the data buffer 104 and the speed of reading out from the data buffer 104 into the storage device 105 when the data flow (at 112 in FIG. 1) speed generated by the reduced recording bitrate approximately equals to the writing speed of the storage device 105; (2) the data amount within the data buffer 104 descends when the data flow (112 in FIG. 1) speed generated by the reduced recording bitrate becomes lower than the writing speed of the storage device 105; or (3) the data amount within the data buffer 104 keeps ascending when the data flow (at 112 in FIG. 1) speed generated by the reduced recording bitrate is still higher than the writing speed of the storage device 105.

In conditional block 234A, the control system 120 of the recording device does not take further action under the above stated result (1), so, the recording device keeps data recording with the reduced bitrate, writing the recorded data into the data buffer 104 and reading the recorded data out into the storage device 105. In this case, the quality of the recording data is optimized because the writing speed of the storage device 105 is fully utilized with the recorded data in data buffer 104.

When the control system 120 of the recording device receives a threshold triggering signal indicating the above stated result (2), i.e. the data amount data amount within the data buffer 104 reaches below the first specified descending threshold, the control system 120 of the recording increases the recording bitrate at 236B. The recording device may return to the initial state defined in block 210, when the recording bitrate is increased to the selected recording speed. On the other hand, when the control system 120 of the recording device receives a threshold triggering signal indicating the above stated result (3), i.e. the data amount within the data buffer 104 reaches above the second specified ascending threshold, the control system 120 of the recording device stops the data recording at 232B. When recording stopped, the control system 120 waits for the available space in the data buffer 104, at block 234B. With blocks 232B and 234B, the system avoids the overflow of the data buffer 104 in order to avoid a recording failure by the recording device.

When the data recording is stopped at 232B, the recorded data within the data buffer 104 will be read out to the storage device 105. In this case, because the data may only be read out from the data buffer 104, the data amount of the data buffer 104 descends. When the data amount of the data buffer 104 reaches below the first specified descending threshold, at 234B, the camera system resumes the selected recording bitrate and the recording device goes back to the initial recording state at 236B. Before the first specified descending threshold is triggered, the control system 120 keeps the data recording stopped in order to wait for the recorded data in the data buffer 104 to be read out to the storage device 105.

The embodiment advantageously can help ensure that the data buffer 104 always has certain data amount as long as the data recording is not terminated by a user. The recorded data available in the data buffer 104 utilizes 100% of the writing speed of the storage device 105 provided that the selected recording speed of the recording device is higher than the writing speed of the storage device 105. Therefore, the quality of the recording data is optimized with the bottleneck limitation of the writing speed of the storage device 105.

In order to make the above embodiments more flexible, the one set of descending thresholds 152 can also include a second specified descending threshold which is greater than the first specified descending threshold. An exemplary preselected ranges for the second specified descending threshold can include between seventy percent (70%) and ninety-five percent (95%) of the buffer size, including any percentage sub-ranges, such as a five percent sub-range (e.g., between seventy-five percent (75%) and eighty percent (80%) and/or a ten percent sub-range (e.g., between eighty percent (80%) and ninety percent (90%)), within the preselected percentage range, without limitation. A preferred percentage value of the second specified descending threshold is ninety percent (90%) of the buffer size.

The second specified plays an intermediate role before the control system 120 of the recording device gets a triggering signal of the first specified descending threshold. For example, when the second specified descending threshold is triggered, the control system 120 of the recording device resumes the data recording with a reduced recording bitrate (not shown). After this, if the data descends below first specified descending threshold, the control system 120 may resumes the selected recording bitrate. If the data amount rebounds above the second specified ascending threshold, the control system 120 stops the data recording again.

The above described embodiments may apply to certain types of recording devices that are capable of continuously data recording where external storage devices are used to store the recorded data. Typical recording devices include cameras with data recording capability and audio recording devices, such as digital voice recorders etc. But the embodiments are not limited to those particular applications.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A method for enabling a recording device with an adjustable recording bitrate to adapt to a predetermined writing speed of a storage device removably attached to the recording device, comprising:

establishing a set of thresholds including a first descending threshold, a first ascending threshold, a second descending threshold, and a second ascending threshold for a data amount, the first ascending threshold being higher than the first descending threshold and lower than the second descending threshold, the second ascending threshold being higher than the second descending threshold;

storing data recorded by the recording device at a selected recording bitrate in a data buffer coupled with the recording device;

writing the recorded data from the data buffer into the storage device;

monitoring the data amount of the recorded data in the data buffer;

monitoring a trend of change in the data amount;

determining whether the data amount has reached a threshold selected from the set of thresholds;

in response to the data amount having reached the first ascending threshold and the trend of change in the data amount being an ascending change, reducing the recording bitrate;

in response to the data amount having reached the second ascending threshold and the trend of change in the data amount being an ascending change, stopping the data recording;

in response to the data amount having reached the first descending threshold and the trend of change in the data amount being a descending change, increasing the recording bitrate; and in response to the data amount being below the second descending threshold, the trend of change in the data amount being a descending change, and the data recording having been stopped, resuming the data recording with a reduced recording bitrate.

2. The method of claim 1, wherein monitoring the trend of change in the data amount comprises comparing amounts of the recorded data within the data buffer by polling the data amount at specified time intervals.

3. The method of claim 1, wherein the establishing the set of thresholds comprises:

establishing the first ascending threshold within a range of sixty percent (60%) to eighty percent (80%) of the buffer size; and establishing the second ascending threshold greater than the first ascending threshold and within a range of seventy percent (70%) to ninety-five (95%) of the buffer size.

4. The method of claim 3, wherein the establishing the set of thresholds comprises:
establishing the first descending threshold within a range of thirty percent (30%) to fifty percent (50%) of the buffer size.

5. The method of claim 4, wherein:
establishing the set of thresholds further comprises establishing the second descending threshold within the range of seventy percent (70%) to ninety-five percent (95%) of the buffer size.

6. The method of claim 1, wherein reducing the recording bitrate comprises reducing the recording bitrate to a range of thirty percent (30%) to eighty percent (80%) of the selected recording bitrate in response to the data amount having reached the first ascending threshold and the trend of change in the data amount being an ascending change.

7. A recording device with an adjustable recording bitrate to adapt to a predetermined writing speed of a storage device removably attached to the recording device, comprising:
a data buffer with a buffer size for storing recorded data and for writing the recorded data into the storage device; and
a control system, configured to:
establish a set of thresholds including a first descending threshold, a first ascending threshold, a second descending threshold, and a second ascending threshold for a data amount, the first ascending threshold being higher than the first descending threshold and lower than the second descending threshold, the second ascending threshold being higher than the second descending threshold;
monitor the data amount of the recorded data in the data buffer;
monitor a trend of change in the data amount;
determine whether the data amount has reached a threshold selected from the set of thresholds;
reduce the recording bitrate in response to the data amount reaching the first ascending threshold and the trend of change in the data amount being an ascending change;
stop the data recording in response to the data amount having reached the second ascending threshold and the trend of change in the data amount being an ascending change;
increase the recording bitrate in response to the data amount having reached the first descending threshold and the trend of change in the data amount being a descending change; and
resume the data recording with a reduced recording bitrate in response to the data amount being below the second descending threshold, the trend of change in the data amount being a descending change, and the data recording having been stopped.

8. The recording device according to claim 7, wherein:
the first ascending threshold is selected within a range of sixty percent (60%) to eighty percent (80%) of the buffer size; and
the second ascending threshold is selected within a range of seventy percent (70%) to ninety-five percent (95%) of the buffer size.

9. The recording device of claim 8, wherein the first descending threshold is selected within a range of thirty percent (30%) to fifty percent (50%) of the buffer size.

10. The recording device of claim 9, wherein the control system is configured to reduce the recording bitrate to a range of thirty percent (30%) to eighty percent (80%) of the selected recording bitrate in response to the data amount reaching the first ascending threshold and the trend of change in the data amount being an ascending change.

11. The recording device of claim 7, wherein the storage device is removably attached with the recording device.

12. An unmanned aerial vehicle, comprising,
a vehicle body; and
a recording device coupled with the vehicle body, the recording device comprising:
a data buffer with a buffer size for storing recorded data and for writing the recorded data into the storage device; and
a control system configured to:
establish a set of thresholds including a first descending threshold, a first ascending threshold, a second descending threshold, and a second ascending threshold for a data amount, the first ascending threshold being higher than the first descending threshold and lower than the second descending threshold, the second ascending threshold being higher than the second descending threshold;
monitor the data amount of the recorded data in the data buffer;
monitor a trend of change in the data amount;
determine whether the data amount has reached a threshold selected from the set of thresholds;
reduce the recording bitrate in response to the data amount reaching the first ascending threshold and the trend of change in the data amount being an ascending change;
stop the data recording in response to the data amount having reached the second ascending threshold and the trend of change in the data amount being an ascending change;
increase the recording bitrate in response to the data amount having reached the first descending threshold and the trend of change in the data amount being a descending change; and
resume the data recording with a reduced recording bitrate in response to the data amount being below the second descending threshold, the trend of change in the data amount being a descending change, and the data recording having been stopped.

* * * * *